(12) United States Patent
Tanabe et al.

(10) Patent No.: US 7,139,534 B2
(45) Date of Patent: Nov. 21, 2006

(54) TRANSMISSION CIRCUIT

(75) Inventors: Mitsuru Tanabe, Osaka (JP); Koichiro Tanaka, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 378 days.

(21) Appl. No.: 10/790,836

(22) Filed: Mar. 3, 2004

(65) Prior Publication Data

US 2004/0185803 A1   Sep. 23, 2004

(30) Foreign Application Priority Data

Mar. 5, 2003   (JP) ............................. 2003-058168

(51) Int. Cl.
*H04B 1/02* (2006.01)
(52) U.S. Cl. ................... 455/108; 455/127.2; 375/300; 375/302
(58) Field of Classification Search ................. 455/91, 455/95, 102, 108, 110, 114.2, 115.1, 127.1, 455/127.2, 127.5, 522, 572, 574; 375/295–298, 375/300, 302; 330/127, 135, 199; 332/144, 332/145, 149, 150, 155
See application file for complete search history.

(56) References Cited

U.S. PATENT DOCUMENTS 3,662,290 A * 5/1972 Elliott .......................... 455/108
4,592,073 A * 5/1986 Watanabe .................... 375/297
5,093,637 A * 3/1992 Isota et al. ................... 375/297
5,193,223 A * 3/1993 Walczak et al. .......... 455/115.1
6,256,482 B1  7/2001 Raab
7,010,280 B1 * 3/2006 Wilson ....................... 455/114.2

FOREIGN PATENT DOCUMENTS

| JP | 2001-320246 A | 11/2001 |
| JP | 2002/530917 A | 9/2002 |
| WO | WO 00/30250 | 5/2000 |

* cited by examiner

*Primary Examiner*—Quochien B. Vuong
(74) *Attorney, Agent, or Firm*—McDermott Will & Emery LLP

(57) ABSTRACT

A transmission circuit includes: a modulated signal generator; a modulated signal line where an OFDM modulated wave flows; a detector; a phase component line for transmitting a phase component; an amplitude component line for transmitting an amplitude component; a level judging circuit for judging the level of the amplitude component; a constant-voltage supply line; first and second selectors; a quadrature converter; and an RF power amplifier. An EER or pseudo-EER technique is performed in a region where the RF input-output characteristic of the RF power amplifier with an EER technique exhibits a linear response, whereas usual modulation is performed in a region where a nonlinear response is exhibited. The modulation method is switched using the level judging circuit and the selectors with reference to a threshold value which is the boundary between the region where the linear response is exhibited and the region where the nonlinear response is exhibited.

13 Claims, 9 Drawing Sheets

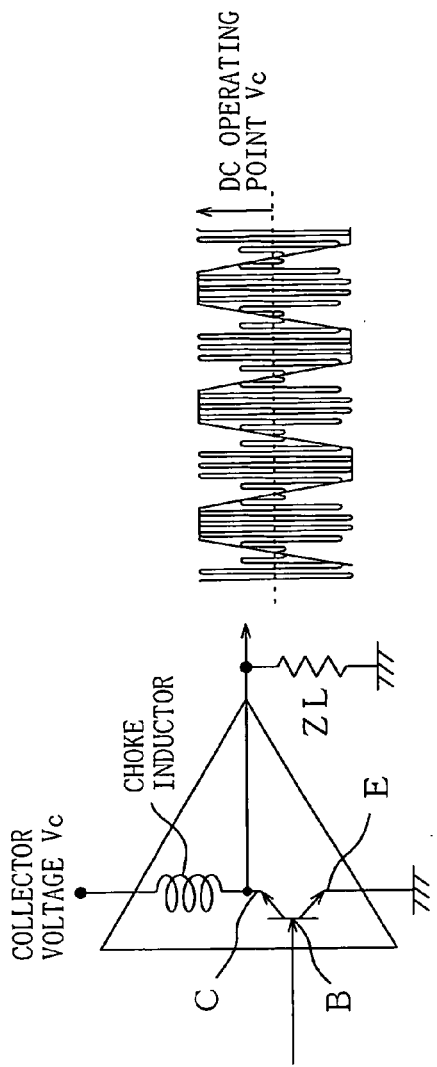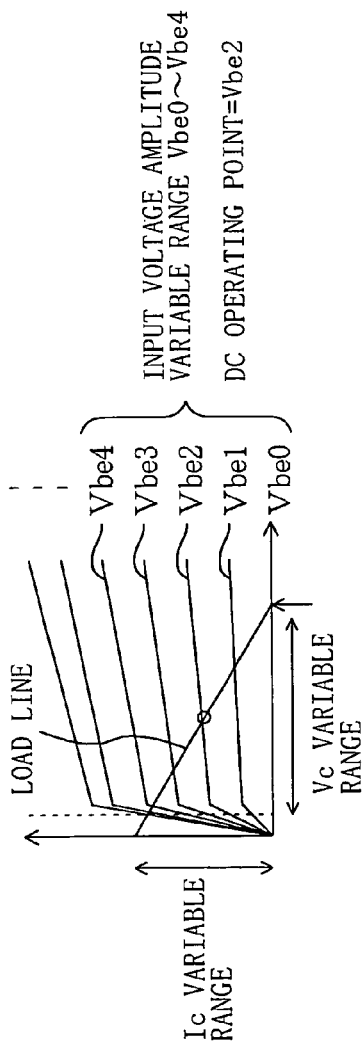
FIG. 7A  FIG. 7B  FIG. 7C  FIG. 7D

US 7,139,534 B2

TRANSMISSION CIRCUIT

BACKGROUND OF THE INVENTION

The present invention relates to circuits for transmitters of radio communications, below denoted as "transmission circuits".

In general, to process modulated signals with amplitude modulation, especially multiple modulation such as Quadrature Amplitude Modulation (QAM), radio-frequency power amplifiers in transmission circuits for transmitting power to antennas need linear amplification. Therefore, class A or AB had been adopted as operation classes of the RF power amplifiers.

However, with the progress of broadband communication, communication methods using subcarrier modulation such as Orthogonal Frequency Division Multiplex (OFDM) have come to be used and high efficiency is not expected any more with the conventional class-A or AB radio frequency amplifiers. That is, in the OFDM modulation, subcarriers are overlapped so that a large amount of power is instantaneously generated at random time and the ratio between the average power and the peak power, i.e., a Peak to Average Power Ratio (PAPR), is high. Therefore, a large amount of DC power always needs to be held in order to allow linear amplification of peak power which is much greater than the average power. With respect to class-A operation, the efficiency is only 50% at the maximum. In particular, in the case of the OFDM modulation, since the PAPR is high, DC power obtained by multiplying current by the difference between the peak voltage for the peak power and the peak voltage for the peak power is lost in the form of heat in almost all the time except for the period in which the peak power is output. Accordingly, the resultant efficiency decreases largely.

As a result, wireless equipments using batteries as their power supplies, for example, have shorter continuous operation time, and thus inconveniences arise in actual application.

To solve this problem, a conventional Envelope Elimination and Restoration (EER) technique known as Kaln Technique was proposed in FIG. 6 of U.S. Pat. No. 6,256,482B1, for example.

FIG. 8 is a circuit block diagram showing a general concept of a known EER technique. In FIG. 8, an OFDM modulated wave (modulated signal) generated by a modulator 401 is input to a detector 402, which is a modulated signal detecting means, through a modulated signal line 410. The detector 402 detects the OFDM modulated wave by dividing the wave into a phase component and an amplitude component. Specifically, the IQ carriers of the OFDM modulated wave generated by the modulator 401 are divided into an amplitude component $\sqrt{(I^2+Q^2)}$ and a phase component $\tan^{-1}(Q/I)$ and these components are detected. The phase component (conjugated phase modulated wave) is transmitted from the detector 402 through phase component lines 411, is up-converted by a phase component quadrature modulator 404, and then is input to an RF input terminal of a PA 405 (RF power amplifier) in the form of RF signal power. The amplitude component (amplitude modulated wave) is transmitted through an amplitude component line 412, is subjected to DC-to-DC conversion in a DC-to-DC converter 403, and then is input to a power-supply-voltage terminal of the PA 405.

Now, as an example of the OFDM modulated wave in the case of IEEE 802.11a, about 7 dB is needed as a backoff (the amount representing how much lower the output power is than the saturation power). That is, only 20% of the RF peak power is used as the RF output power, so that the efficiency deteriorates from 50% to 10%. To use the class-A or AB PA with high efficiency, the minimum power-supply voltage required to output RF power is successively applied to the PA and the backoff is ideally 0 dB.

To solve this problem, in the EER technique, a modulated signal wave in which a quadrature modulation has been performed on a phase component obtained by polar mapping of a modulated signal is applied to the PA 405. The modulated wave with this phase component is a sine wave whose amplitude is constant and whose phase changes with time, so that the PA 405 is operable with a backoff of almost 0 dB. As the output of the PA 405, the amplitude component input from the power-supply-voltage terminal is multiplied by the phase component, so that the same modulated wave as that obtained by performing the quadrature modulation on the original modulated signal is obtained.

SUMMARY OF THE INVENTION

However, the known EER technique has a drawback in which the modulated signal wave is not restored correctly because the resultant spectrum mask or EVM (Error Vector Magnitude) does not satisfy the wireless standard in the response of the output voltage of the PA 405 with constant power applied thereto with respect to the power supply voltage thereof.

FIGS. 9A, 9B and 9C are graphs respectively showing the voltage amplitude Vin of an amplitude component input to a power-supply-voltage terminal VDD of the conventional PA 405, the response characteristic of an output voltage RFout with respect to an input voltage to the power-supply-voltage terminal VDD of the PA 405, and the voltage amplitude of the output voltage RFout with respect to the voltage amplitude Vin. As shown in FIG. 9B, the response of the PA 405 is a nonlinear response. Accordingly, if the EER technique is conducted, the phase component is multiplied by the amplitude component at the output of the PA 405, so that an error in the amplitude component at 1V or less causes the EVM and the spectrum to deteriorate when a modulated signal wave is generated.

It is therefore an object of the present invention to provide a transmission circuit using an EER technique by which no signal deterioration occurs even with a PA exhibiting a nonlinear response.

As a basic configuration of a transmission circuit according to the present invention, at least an amplitude component of a modulated signal, which includes a phase component and the amplitude component, is detected, an amplitude component line for transmitting the amplitude component is provided, and judging means for judging whether or not an amplitude value of the amplitude component of the modulated signal is larger than a threshold value is provided on the amplitude component line.

With this configuration, it is possible to change a transmission method depending on the level of the amplitude component of the modulated signal, so that drawbacks of normal class-A operation and drawbacks in using an EER technique are suppressed. It is sufficient that the threshold value is set at a value corresponding to a boundary between the region in which a signal to be transmitted exhibits a linear response and the region in which the signal exhibits a nonlinear response. The linear response region is a region in which the linearity satisfies the spectrum mask and the EVM specified by the wireless standard under operation in which an appropriate offset voltage is applied to the response and the voltage amplitude component is multiplied by a constant of proportion such that the response range includes a voltage amplitude swing of the amplitude component of the modulated signal. The nonlinear response region is a region in which the linearity does not satisfy the wireless standard under the same operation. In this manner, it is possible to adopt a high-efficiency technique such as an EER technique in the region in which the signal to be transmitted satisfies the wireless standard, while adopting a technique capable of suppressing deterioration in the quality of the signal in the region in which the signal does not satisfy the wireless standard.

In the basic configuration described above, if the phase component as well as the amplitude component is detected and first selection outputting means for outputting the modulated signal to a modulated signal line if the amplitude value of the amplitude component is smaller than or equal to the threshold value and outputting the phase component to a phase component line for transmitting the phase component if the amplitude value is larger than the threshold value is provided, and second selection outputting means for outputting a constant voltage to a constant-voltage supply line if the amplitude value of the amplitude component is smaller than or equal to the threshold value and outputting the amplitude component to the amplitude component line if the amplitude value is larger than the threshold value is provided, then the outputs of the first and second selection output means are respectively connected to an RF input terminal and a power-supply-voltage terminal of an RF power amplifier. Accordingly, an EER technique is performed only in the region in which the response of the amplitude of the output from the RF output of the RF power amplifier satisfies the wireless standard and a usual modulation is performed in the region in which the response does not satisfy the wireless standard. As a result, it is possible to prevent signal deterioration that can be caused when EER is performed in the region in which the response of the RF power amplifier does not satisfy the wireless standard, thus implementing a transmission circuit with high efficiency and without deterioration of the signal to be transmitted.

The inventive transmission circuit may further include DC-to-DC converting means connected to the second selection outputting means and performing voltage conversion on an output signal from the second selection outputting means.

The inventive transmission circuit may further include means for specifying the level of output power to modulated signal generating means. Then, the output power level to be output is specified to the modulated signal generating means, so that the output power level is arbitrarily set by setting the IQ level using the modulated signal generating means.

The inventive transmission circuit may further include frequency converting means disposed between the first selection outputting means and the RF power amplifier. Then, it is possible to process an RF signal covering a wider band. For example, since the DA converter handles signals with frequencies in the band of several hundreds MHz at most, the DA converter cannot process carriers whose frequencies exceed GHz. However, if the frequency converting means such as a quadrature converter is used, the carrier frequency is up-converted easily.

In addition to the basic configuration described above, the inventive transmission circuit may include selection outputting means for outputting a constant voltage to the constant-voltage supply line if the amplitude value of the amplitude component is smaller than or equal to the threshold value and outputting the amplitude component to the amplitude component line if the amplitude value is larger than the threshold value, depending on the judgment result of the judging means. Then, a pseudo-EER technique which is substantially the same as an EER technique is performed only in the region in which the response of the amplitude of the output from the RF output terminal of the RF power amplifier satisfies the wireless standard and a usual modification is performed in the region in which the response does not satisfy the wireless standard. As a result, it is possible to prevent signal deterioration that can be caused when EER is performed in the region in which the response of the RF power amplifier does not satisfy the wireless standard, thus implementing a transmission circuit with high efficiency and without deterioration of the signal to be transmitted.

In such a case, if frequency converting means is provided between the modulated signal generating means and the RF power amplifier, it is possible to process an RF signal covering a wider band. For example, since the DA converter handles signals with frequencies in the band of several hundreds MHz at most, the DA converter cannot process carriers whose frequencies exceed GHz. However, if the frequency converting means such as a quadrature converter is used, the carrier frequency is up-converted easily.

BRIEF DESCRIPTION OF THE DRAWINGS

FIGS. 7A through 7D are diagrams for describing circuit operation in which a pseudo-EER technique is performed using a constant envelope region.

DESCRIPTION OF THE PREFERRED EMBODIMENTS

Embodiment 1

Hereinafter, a first embodiment of the present invention will be described with reference to the drawings. In this embodiment, OFDM is adopted for a modulation scheme. Examples of systems using OFDM are based on IEEE 802.11a standard, one of the wireless LAN standards. In a wireless LAN system, each of the 52 orthogonal subcarriers is modulated by, for example, 64 QAM, then an inverse discrete Fourier transform is conducted, and then each resultant carrier is multiplexed, thus obtaining an OFDM modulated signal. The 52 carriers are separated with a spacing of 312.5 kHz and occupy 52×312.5=16.25 MHz in total.

Figure 1:
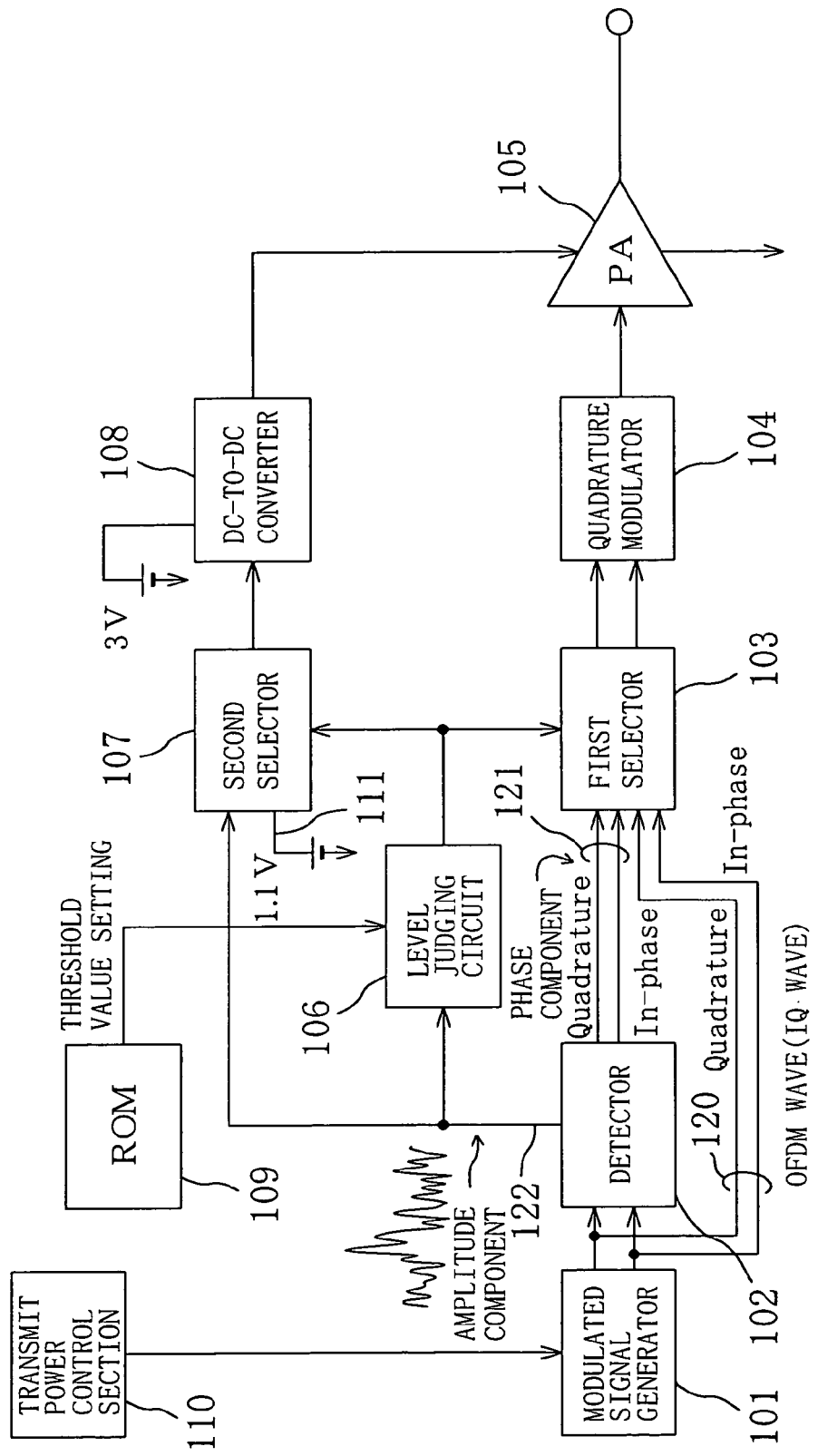
FIG. 1 is a circuit block diagram showing a transmission circuit according to a first embodiment of the present invention.

FIG. 1 is a circuit diagram showing a transmission circuit for implementing an EER technique according to the first embodiment. As shown in FIG. 1, the transmission circuit includes: a modulated signal generator 101 as a modulated signal generating means for generating an OFDM modulated wave (modulated signal) including an amplitude component and a phase component; modulated signal lines 120 through which the OFDM modulated wave flows; a detector 102 as a modulated signal detecting means for detecting the amplitude component and the phase component of the OFDM modulated wave; phase component lines 121 for transmitting the phase component of the OFDM modulated wave; an amplitude component line 122 for transmitting the amplitude component of the OFDM modulated wave; a level judging circuit 106 as a judging means for judging whether the level of the amplitude component of the OFDM modulated wave is higher than a threshold voltage level or not; a ROM 109 as a storage means for storing a threshold voltage level to be used as a reference for the level judgment of the level judging circuit 106; a constant-voltage supply line 111 connected to a power-supply-voltage terminal at which a voltage of 1.1 V is received and used for supplying a constant voltage of 1.1 V; a first selector 103 as a first selection outputting means for selecting either one of the OFDM modulated wave from the modulated signal generator 101 and the phase component from the detector 102, based on the judgment result of the level judgment circuit 106; a signal selector 107 as a second selection outputting means for selecting either one of the amplitude component input through the amplitude component line 122 and the constant voltage of 1.1 V supplied through the constant voltage line 111, based on the judgment result of the level judgment circuit 106; a DC-to-DC converter 108; a quadrature modulator 104 for performing a quadrature modulation on an output from the first selector 103; and a PA 105 (RF amplifier) for receiving an RF signal output from the quadrature modulator 104 at its RF input terminal and receiving the amplitude component from the DC-to-DC converter 108 at its power-supply-voltage terminal; and a transmit power control section 110 for specifying output power to the modulated signal generator 101.

The modulated signal generator 101 generates the above-described OFDM modulated wave (modulated signal). The OFDM modulated wave generated by the modulated signal generator 101 is input to the first selector 103 through the modulated signal lines 120.

The detector 102 detects the OFDM modulated wave flowing through the modulated signal lines 120 by dividing the wave into a phase component (a conjugated phase modulated wave) and an amplitude component (an amplitude modulated wave). Specifically, the IQ vector wave of the OFDM modulated wave generated by the modulated signal generator 101 is divided into an amplitude component $\sqrt{(I^2+Q^2)}$ and a phase component $\tan^{-1}(Q/I)$ and these components are detected. The phase component is input to the first selector 103 through the phase component lines 121 as an IQ modulated wave, and the amplitude component is input to the second selector 107 through the amplitude component line 122.

The level judging circuit 106 receives the threshold voltage level stored in the ROM 109 and the amplitude component flowing through the amplitude component line 122 and judges whether or not the voltage level of the amplitude component is higher than the threshold voltage level.

The first selector 103 selects and outputs one of the phase component of the OFDM modulated wave input through the phase component lines 121 and the OFDM modulated wave input through the modulated signal lines 120, based on the judgment result of the level judging circuit 106. At this time, if the voltage level of the amplitude component flowing through the amplitude component line 122 is lower than or equal to the threshold voltage level stored in the ROM 109, the first selector 103 selects and outputs the OFDM modulated wave as a modulated signal, while selecting and outputting the phase component from the detector 102 if the voltage level of the amplitude component is higher than the threshold voltage level.

The second selector 107 selects and outputs one of the constant voltage of 1.1 V from the constant-voltage supply line 111 and the amplitude component input through the amplitude component line 122, based on the judgment result of the level judging circuit 106. At this time, if the voltage level of the amplitude component flowing through the amplitude component line 122 is lower than or equal to the threshold voltage level stored in the ROM 109, the second selector 107 selects and outputs the constant voltage of 1.1 V from the constant-voltage supply line 111, while selecting and outputting the amplitude component from the detector 102 if the voltage level of the amplitude component is higher than the threshold voltage level.

The quadrature modulator 104 changes the conjugated phase modulated wave (Quadrature and In-phase) output from the first selector 103 into an RF signal.

The DC-to-DC converter 108 amplifies the output from the second selector 107 and supplies an amplitude modulated signal having a desired voltage amplitude to the power-supply-voltage terminal of the PA 105.

The PA 105 is a class-A RF power amplifier and receives the RF signal output from the quadrature modulator 104 at its RF input terminal. When the system adopts an EER technique, the PA 105 receives the amplitude component subjected to DC conversion by the DC-to-DC converter 108 at its power-supply-voltage terminal. As a result, the PA 105 outputs a modulated wave whose phase and amplitude have been modulated, i.e., a modulated wave in which the amplitude is multiplied by the phase. If the system adopts a usual IQ quadrature modulation, the PA 105 fixes the voltage to be supplied from its power-supply-voltage terminal at 1.1 V to perform linear amplification.

The transmit power control section 110 receives specification regarding transmission power control from a Media Access Control (MAC) or other sections.

Example of Signal Change in Processing

Figure 2:
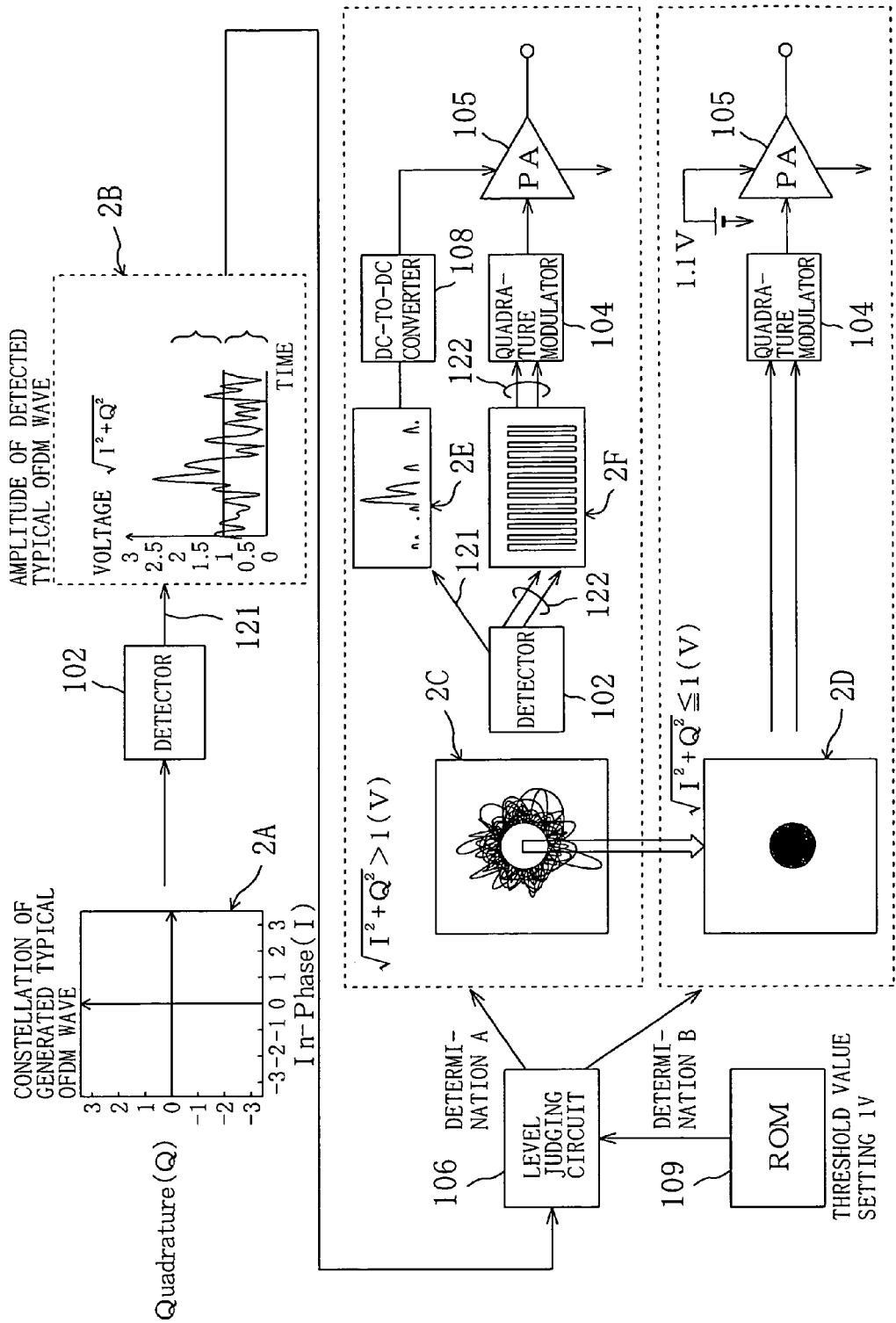
FIG. 2 is a diagram for describing an example of change of a signal processed in the transmission circuit of the first embodiment.
Figure 3A:
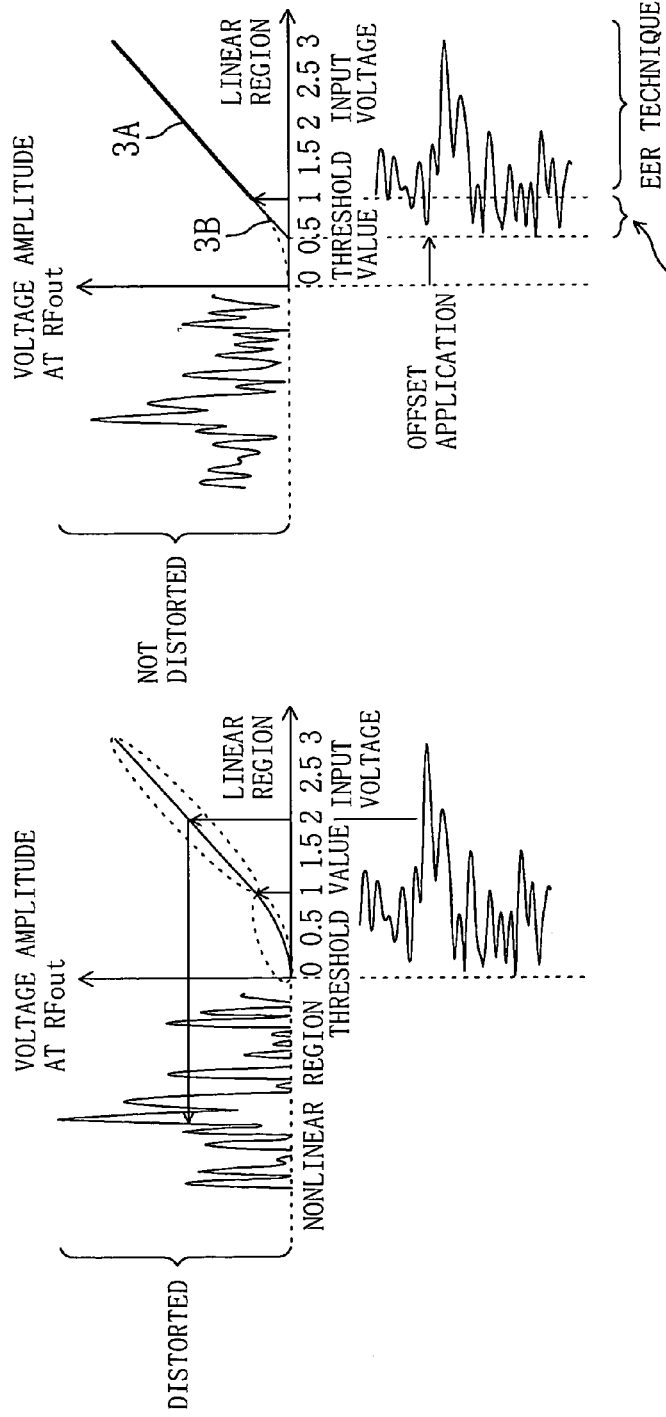
FIGS. 3A and 3B are graphs showing response characteristics of the voltages of output signals of RF amplifiers with respect to input voltages input to power-supply-voltage terminals of the RF amplifiers in a conventional transmission circuit and the transmission circuit of the first embodiment, respectively.
Figure 3B:
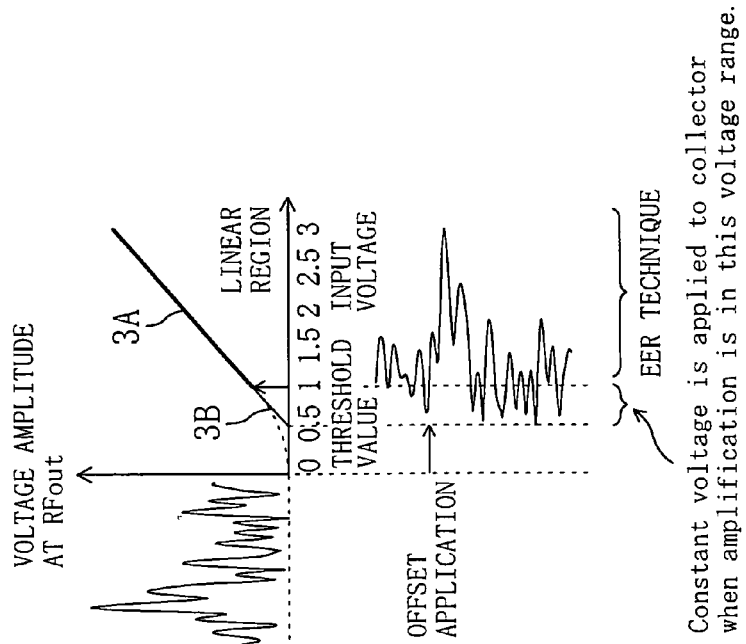

FIG. 2 is a diagram for describing an example of change of a signal processed in the transmission circuit of this embodiment. FIGS. 3A and 3B are graphs showing response characteristics of the voltages of output signals RFout of the RF amplifiers 405 and 105 with respect to input voltages input to power-supply-voltage terminals of the RF amplifiers 405 and 105 in a conventional transmission circuit and the transmission circuit of this embodiment, respectively.

As shown in FIG. 2, the output level specified by, for example, the MAC is input to the modulated signal generator 101 via the transmit power control section 110 so that an IQ quadrature signal of an OFDM modulated wave exhibiting a constellation as shown in graph 2A in FIG. 2 is generated in accordance with the output level. The OFDM modulated wave is detected by the detector 102, being divided into an amplitude component shown in graph 2B in FIG. 2 and a conjugated phase component (phase component) (not shown). The level judging circuit 106 compares the output amplitude component with the threshold voltage level set in the ROM 109 to judge whether or not the level of the amplitude component is higher than the threshold voltage level.

As shown in FIG. 3A, for example, the threshold voltage level set in the ROM 109 is herein the minimum value, e.g., 1V, in a linear region in which the response characteristic between an input voltage of the RF power amplifier and the voltage of an output signal thereof exhibits a sufficient linear response. Alternatively, the threshold voltage level may be set by an appropriate formula manipulation. The linear region is herein the range in which an output spectrum or EVM (Error Vector Magnitude) of an output satisfies the wireless standard of communication systems, and does not mean that the response characteristic is a perfect linear characteristic.

The level judging circuit 106 judges whether the level of the amplitude component generated by the detector 102 is higher than the threshold voltage level judgment A) or is lower than or equal to the threshold voltage level judgment B), and outputs the judgment result A or B to the selectors 107 and 103.

If the judgment A is input from the level judging circuit 106, i.e., the amplitude component is in the state shown in graph 2C in FIG. 2, the second selector 107 selects the amplitude component (see graph 2E in FIG. 2) input from the detector 102 through the amplitude component line 122, whereas the first selector 103 selects the phase component (see graph 2F in FIG. 2) input from the detector 102 through the phase component lines 121.

In this case, an EER technique is adopted in the transmission circuit. This EER technique allows the PA 105 to operate near a saturation point, i.e., to operate with the theoretical maximum efficiency. Accordingly, if the EER technique is performed, higher efficiency is achieved.

On the other hand, if the judgment B is input from the level judging circuit 106, i.e., the amplitude component is in the state shown in graph 2D in FIG. 2, the first selector 103 selects the OFDM modulated wave (modulated signal) input from the modulated signal generator 101 through the modulated signal lines 120 and the second selector 107 selects the constant voltage of 1.1 V.

In this case, a usual IQ quadrature modulation is adopted in the transmission circuit. Accordingly, a small margin is added to the threshold voltage, which is herein set at 1V, and therefore the constant voltage to be supplied to the PA 105 is set at, for example, 1.1 V. Suppose the average voltage of a modulated wave having an amplitude of 1V or less is 0.8 V, the PA 105 operates with a backoff of about 2 dB. At this time, the efficiency is 31.5%, which is 63% of the theoretical efficiency in class-A operation of 50%. Suppose operation of the PA 105 with the EER technique is saturation operation, a theoretical efficiency of 50% is achieved. Accordingly, suppose the amplitude at the threshold voltage of 1 V or higher is about 10%, the efficiency expected with the configuration of this embodiment is 50×0.1+31.5×0.9=33.4%.

On the other hand, if only the usual quadrature modulation is performed, an efficiency as small as 10% is obtained. However, according to the present invention, the efficiency is greatly improved.

In a conventional transmission circuit, as shown in FIG. 3A, a nonlinear region in which the wireless standard is not satisfied is present in the response characteristic of the voltage amplitude at the RF output terminal RFout of the RF amplifier with respect to the voltage input to the power-supply-voltage terminal thereof, so that the output signal is distorted as shown in the left-part of FIG. 3A. On the other hand, in this embodiment, an offset voltage applied to the amplitude component is appropriately adjusted in the DC-to-DC converter (where the offset voltage is 0.5 V in this embodiment) and, if the voltage level of the amplitude component is lower than or equal to the threshold voltage level, a usual quadrature modulation is performed. Accordingly, it is possible to make the entire response characteristic including 3A and 3B of the voltage amplitude at the terminal RFout with respect to the input voltage satisfies the wireless standard. As a result, the amplitude component is output without distortion as shown in the left-part of FIG. 3B. As already described above, the linear region in this case also means that the resultant spectrum output from the power amplifier or EVM of the output satisfies the wireless standard of communication systems, and does not mean that the response characteristic is a perfect linear characteristic.

Embodiment 2

Figure 4:
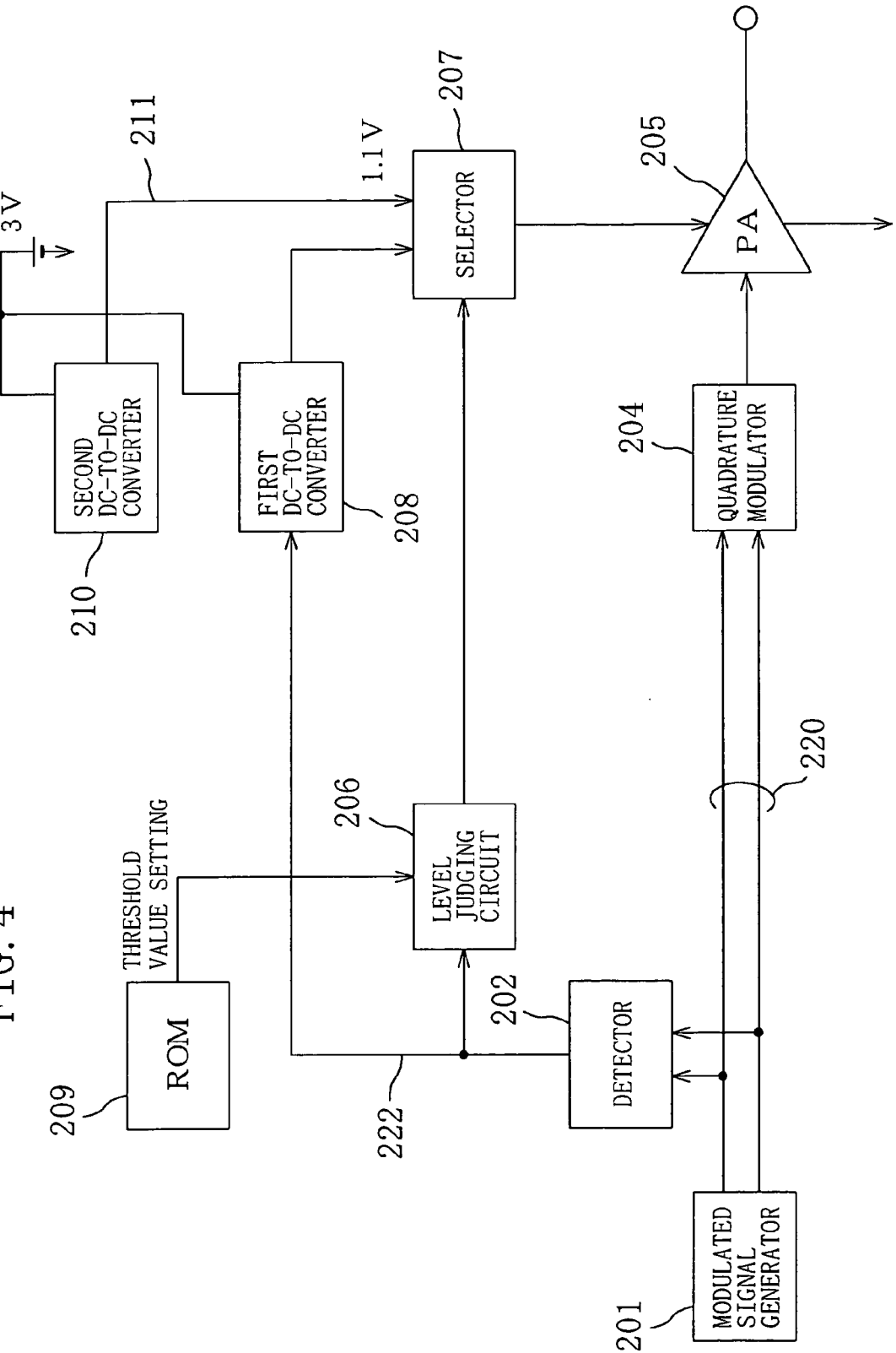
FIG. 4 is a circuit block diagram showing a transmission circuit according to a second embodiment of the present invention.

In this embodiment, OFDM is also adopted for modulation. FIG. 4 is a circuit block diagram schematically showing a configuration of a transmission circuit according to a second embodiment of the present invention. As shown in FIG. 4, the transmission circuit includes: a modulated signal generator 201 as a modulated signal generating means for generating an OFDM modulated wave (modulated signal) including an amplitude component and a phase component; modulated signal lines 220 through which the OFDM modulated wave flows; a detector 202 as a modulated signal detecting signal for detecting the amplitude component and the phase component of the OFDM modulated wave; an amplitude component line 222 for transmitting the amplitude component of the OFDM modulated wave; a level judging circuit 206 as a judging means for judging whether the level of the amplitude is higher than a threshold voltage level or not; a ROM 209 as a storage means for storing a threshold voltage to be used as a reference for the level judgment of the level judging circuit 206; a first DC-to-DC converter 208 provided on the amplitude component line 222 and performing DC-to-DC conversion on the amplitude component; a constant-voltage supply line 211 for supplying a constant voltage; a second DC-to-DC converter 210 interposed in the constant-voltage supply line 211 and performing DC-to-DC conversion on a constant voltage of 3 V to output a constant voltage of 1.1 V; a signal selector 207 as a selection outputting means for selecting either one of the amplitude component supplied from the first DC-to-DC converter 208 and the constant voltage of 1.1 V supplied from the second DC-to-DC converter 210, based on the judgment result of the level judgment circuit 206; a quadrature modulator 204 for performing a quadrature modulation on the OFDM modulated wave transmitted through the modulated signal lines 220; and a PA 205 as an constant-saturation RF power amplifier for receiving an RF signal output from the quadrature modulator 204 at its RF input terminal and receiving the amplitude component from the selector 207 at its power-supply-voltage terminal.

In this embodiment, a circuit element having the same function as the transmit power control section 110 for specifying output power to the modulated signal generator 101 in the first embodiment may also be provided.

The constant-voltage supply line 211 is for supplying a constant voltage of 1.1 V converted by the second DC-to-DC converter 210.

The detector 202 performs operation for obtaining the absolute value of a conjugated modulated vector of the modulated signal (OFDM modulated wave), thereby obtaining the amplitude component.

The level judging circuit 206 receives the threshold voltage level stored in the ROM 209 as a storage means and the amplitude component flowing on the amplitude component line 222 and judges whether or not the voltage level of the amplitude component is higher than the threshold voltage level.

The first DC-to-DC converter 208 amplifies the amplitude component input from the detector 202 through the amplitude component line 222 and supplies the amplitude component with a desired voltage amplitude to the power-supply-voltage terminal of the PA 205 and, at the same time, supplies a DC power required by the PA 205.

The selector 207 selects and outputs one of the constant voltage of 1.1 V from the constant-voltage supply line 211 and the amplitude component input through the amplitude component line 222, based on the judgment result of the level judging circuit 206. At this time, if the voltage level of the amplitude component flowing on the amplitude component line 222 is lower than or equal to the threshold voltage level stored in the ROM 209, the selector 207 selects and outputs the constant voltage of 1.1 V from the constant-voltage supply line 211, while selecting and outputting the amplitude component output from the detector 202 through the first DC-to-DC converter 208 if the voltage level of the amplitude component is higher than the threshold voltage level.

The quadrature modulator 204 changes the OFDM wave (modulated wave), which is a conjugated phase modulated wave (Quadrature and In-phase) output from the detector 202, into an RF signal.

The PA 205 as an RF power amplifier is a class-A amplifier and receives the RF signal output from the quadrature modulator 204 at its RF input terminal. When the system substantially adopts an EER technique, the PA 205 receives the amplitude component subjected to DC-to-DC conversion by the first DC-to-DC converter 208 at its power-supply-voltage terminal. As a result, the PA 205 outputs, from its RF output terminal, a modulated wave whose phase and amplitude have been modulated, i.e., a modulated wave in which the amplitude is multiplied by the phase. If the system adopts a usual IQ quadrature modulation, the voltage supplied from the power-supply-voltage terminal of the PA 205 is fixed at the constant voltage of 1.1 V supplied from the constant-voltage supply line 211.

Example of Signal Change in Processing

Figure 6:
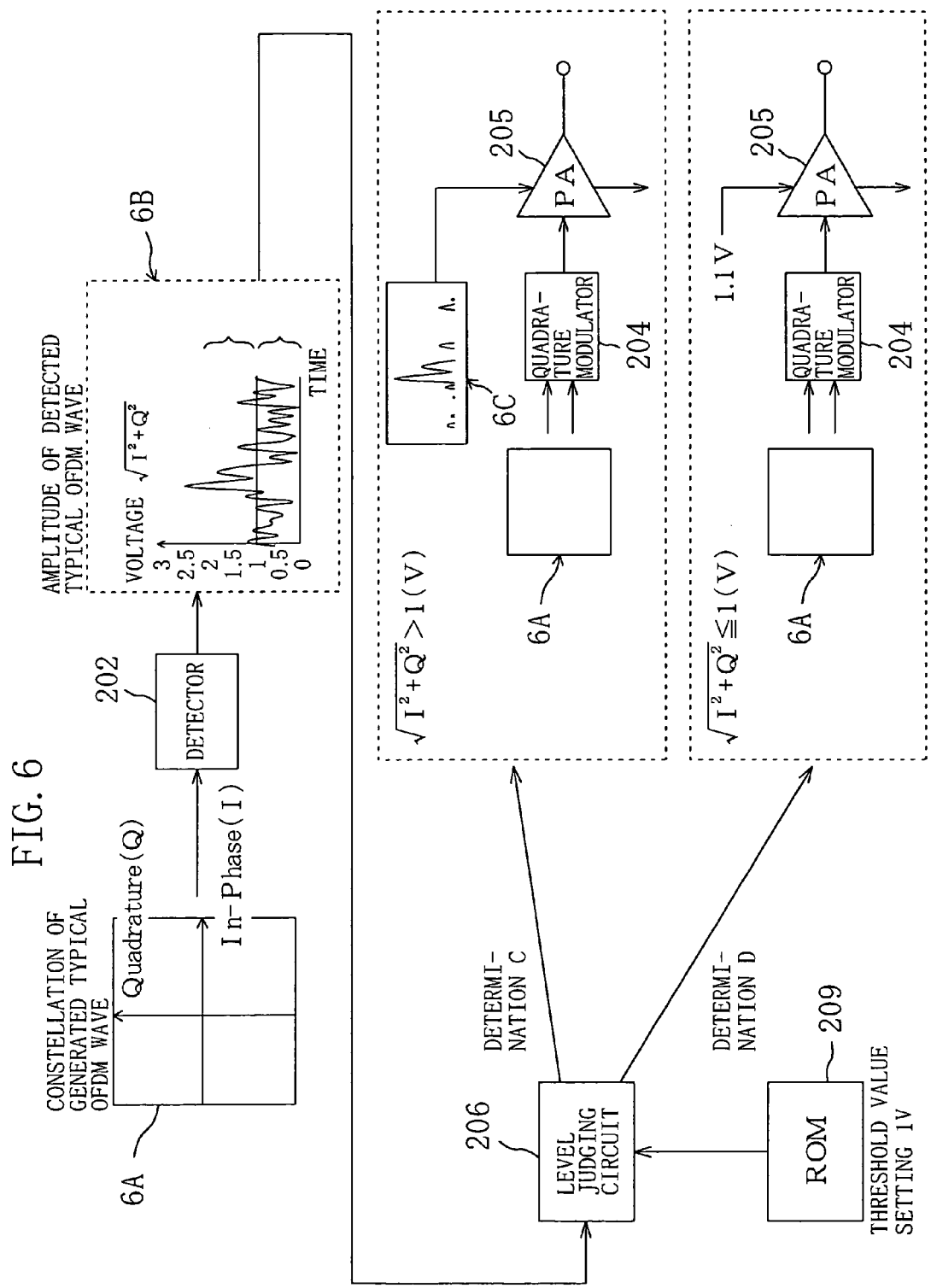
FIG. 6 is a diagram for describing an example of change of a signal processed in the transmission circuit of the second embodiment.
Figure 8:
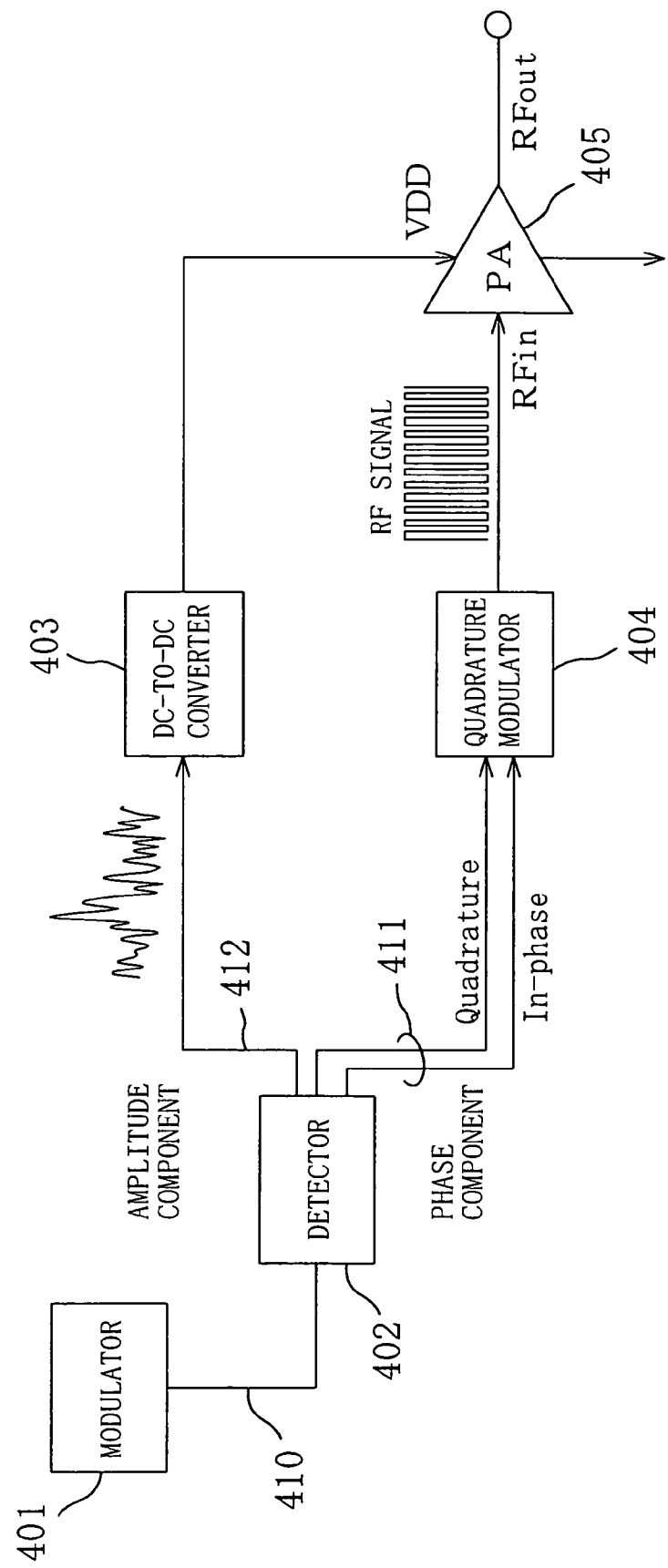
FIG. 8 is a circuit block diagram showing a general concept of a known EER technique.
Figure 9A:
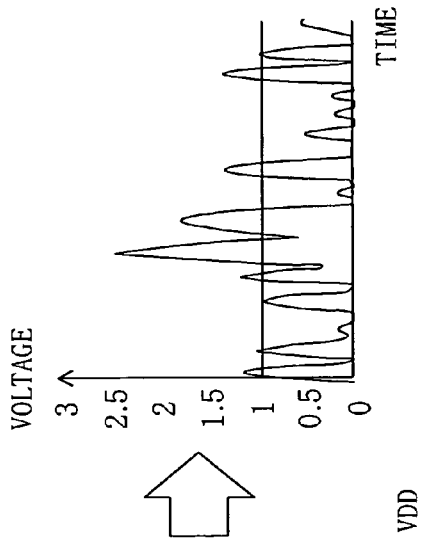
FIGS. 9A, 9B and 9C are graphs respectively showing the voltage amplitude Vin of an amplitude component input to a power-supply-voltage terminal of a conventional PA, the response characteristic of an output voltage RFout with respect to an input voltage to the power-supply-voltage terminal, and the voltage amplitude of the output voltage RFout with respect to the voltage amplitude Vin.
Figure 9B:
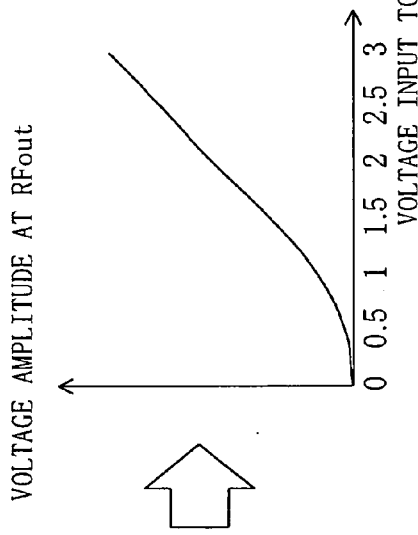
Figure 9C:
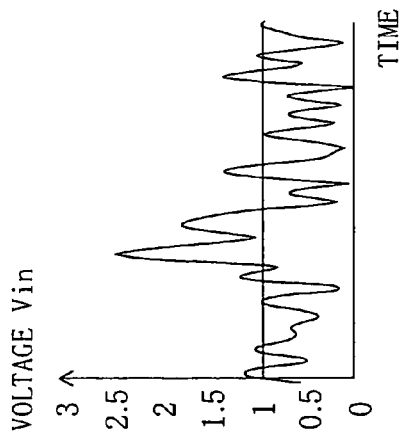

FIG. 6 is a diagram for describing an example of change of a signal processed in the transmission circuit of this embodiment.

As shown in FIG. 6, the detector 202 detects an amplitude component as shown in graph 6B in FIG. 6 from an OFDM modulated wave (conjugated vector signal) exhibiting a constellation as shown in graph 6A in FIG. 6 and generated by the modulated signal generator 201. The level judging circuit 206 compares the output amplitude component with the threshold voltage level set in the ROM 209 to judge whether or not the level of the amplitude component is higher than the threshold voltage level.

As shown in FIG. 3A, for example, the threshold voltage level set in the ROM 209 is herein the minimum value, e.g., 1V, in a linear region in which the response characteristic between an input voltage of the RF power amplifier and the voltage of an output signal thereof exhibits a sufficient linear response. Alternatively, the threshold voltage level may be set by an appropriate formula manipulation. The linear region is herein the range in which an output spectrum or EVM of an output satisfies the wireless standard of communication systems, and does not mean the response characteristic is a perfect linear characteristic.

The level judging circuit 206 judges, using this threshold voltage level of 1V, whether the level of the amplitude component generated by the detector 202 is higher than the threshold voltage level (judgment C) or is lower than or equal to the threshold voltage level (judgment D), and outputs the judgment result C or D to the selector 207.

Unlike the first embodiment, in this embodiment, the modulated signal (OFDM modulated wave) generated by the modulated signal generator 201 is input to the RF input terminal of the PA 205 irrespective of whether the level judging circuit 206 outputs the judgment result C or D (see graph 6A in FIG. 6). The OFDM modulated wave is detected by the detector 202, being divided into an amplitude component shown in graph 6B in FIG. 6 and a conjugated phase component (phase component) (not shown). The level judging circuit 206 compares the output amplitude component with the threshold voltage level set in the ROM 209 to judge whether or not the level of the amplitude component is higher than the threshold voltage level.

If the judgment C is input from the level judging circuit 206, the selector 207 selects the amplitude component input from the detector 202 through the amplitude component line 222 (see graph 6C in FIG. 6). In this case, the input signal to the RF power amplifier is not a phase component as in the first embodiment but is a usual modulated wave having an amplitude component, and a pseudo-EER technique is adopted in the transmission circuit. Accordingly, this pseudo-EER technique allows the PA 205 to operate near a saturation point, i.e., to operate with the theoretical maximum efficiency. Operation by the pseudo-EER technique will be described in detail later.

On the other hand, if the judgment D is input from the level judging circuit 206, the selector 207 selects the constant voltage of 1.1 V.

In this case, a usual IQ quadrature modulation is adopted in the transmission circuit. Accordingly, a small margin is added to the threshold voltage, which is herein set at 1V, and therefore the constant voltage to be supplied to the PA 205 is set at, for example, 1.1 V. Suppose the average voltage of a modulated wave having an amplitude of 1V or less is 0.8 V, the PA 205 operates with a backoff of 2 dB. At this time, the efficiency is 31.5%, which is 63% of the theoretical efficiency in class-A operation of 50%. Suppose operation of the PA 205 with the EER technique is saturation operation, a theoretical efficiency of 50% is achieved. Accordingly, suppose the amplitude at the threshold voltage of 1 V or higher is about 10%, the efficiency expected with the configuration of this embodiment is 50×0.1+31.5×0.9=33.4%.

On the other hand, if only the usual quadrature modulation is performed, an efficiency as small as 10% is obtained. However, according to the present invention, the efficiency is greatly improved.

In addition, in this embodiment, an EER technique is substantially performed with not the phase component but the modulated signal being input to the RF input terminal of the PA 205 without change. Accordingly, it is possible to avoid deterioration in Error Vector Magnitude (EVM), which is inevitable in known EER techniques by which only the phase component is input to the RF terminal of the RF power amplifier.

In a conventional transmission circuit, as shown in FIG. 3A, a nonlinear region in which the wireless standard is not satisfied is present in the response characteristic of the voltage amplitude at the RF output terminal RFout of the RF power amplifier with respect to a voltage input to the power-supply-voltage terminal thereof, so that the output signal is distorted as shown in the left-part of FIG. 3A. On the other hand, in this embodiment, an offset voltage applied to the amplitude component is appropriately adjusted in the DC-to-DC converter (where the offset voltage is 0.5 V in this embodiment) and, if the voltage level of the amplitude component is lower than or equal to the threshold voltage level, a usual quadrature modulation is performed. Accordingly, it is possible to make the entire response characteristic including 3A and 3B of the voltage amplitude at the terminal RFout with respect to the input voltage satisfy the wireless standard as shown in FIG. 3B. As a result, the amplitude component is output without distortion as shown in the left-part of FIG. 3B. As already described above, the linear region in this case also means that the resultant spectrum output from the power amplifier or EVM of the output satisfies the wireless standard of communication systems, and does not mean that the response characteristic is a perfect linear characteristic.

Specifically, in a case where only the phase component is input to the RF input terminal of the RF power amplifier, filtering is performed on the phase component to an extent that would not affect the EVM within a range allowable in the band of a digital-to-analog converter. The partial decrease in the level of the phase component caused by this filtering greatly deteriorates the EVM when the phase component is synthesized with the amplitude component at the output of the RF power amplifier. In addition, the necessary bandwidth of the modulated signal is about ⅙ smaller than that of the phase component separated from the modulated signal, so that it is possible to narrow the bandwidth of a digital-to-analog converter or an anti-alias filter for suppressing spurious components generated by digital-to-analog conversion. Accordingly, this embodiment is effective for reduction of power consumption of a digital-to-analog converter, downsizing of an inductor used for the filter, and cost reduction.

In addition, in a conventional transmission circuit, the input power couples to the output depending on an isolation characteristic between the input and output of RF power to/from the RF power amplifier, so that an amplitude causing an error in the output of the RF power amplifier appears even when the amplitude component is zero. On the other hand, in this embodiment, when the amplitude component supplied to the power-supply-voltage terminal of the RF power amplifier is zero, the power input to the RF input terminal of the RF power amplifier is also zero. Accordingly, a correctly-modulated wave is formed at the output of the RF power amplifier independently of the isolation characteristic.

FIGS. 7A through 7D are diagrams for describing circuit operation in which a pseudo-EER technique is performed using a constant envelope region.

The modulated wave (OFDM modulated wave in this embodiment) input to the RF power amplifier is herein a triangular wave in which the envelope of the amplitude is triangular as shown in FIG. 7A for simplicity. FIG. 7B shows the internal structure of the RF power amplifier. The RF power amplifier of this embodiment is comprised of a common emitter bipolar transistor. The OFDM modulated wave which is the modulated signal in this embodiment is input to the base (RF input terminal) of the bipolar transistor. This RF power amplifier is expressed by a simplified circuit in which a choke inductor is inserted between the collector (power-supply-voltage terminal) of the bipolar transistor and a terminal at which a collector voltage Vc is supplied and a line connecting the collector to the RF output terminal is grounded via an output load ZL.

FIG. 7D is a graph for explaining an input-output characteristic of the RF power amplifier. The ordinate represents a collector current Ic of the RF power amplifier and the abscissa represents the collector voltage Vc applied to the power-supply-voltage terminal of the RF power amplifier. FIG. 7D shows that the Ic-Vc characteristic changes with respect to the base-emitter voltage Vbe of the RF power amplifier and that a load line, which is determined by the DC base-emitter voltage Vbe, the DC current collector voltage Vc and the output load ZL of the RF power amplifier, determines the variable range of the base-emitter voltage Vbe and also determines the variable ranges of the collector current Ic and the collector voltage Vc.

FIG. 7C shows the resultant output voltage from the RF output terminal of the RF power amplifier. The output power is determined by this output voltage and the output impedance ZL.

When the input voltage exceeds the variable range (Vbe4–Vbe2 in FIG. 7D) of the base-emitter voltage Vbe, the corrector current exceeds the variable range of the collector current Ic determined by the load line, thus creating a (constant envelope) time region in which the current amplitude is constant. The voltage amplitude is obtained by voltage conversion performed on the collector current Ic with the load impedance ZL at the output, so that a constant (constant envelope) time region is also created in the voltage amplitude Vout (=Ic·ZL). A signal having a constant envelope region is substantially equivalent to a phase component, so that the same processing is performed in function as in EER in which the phase component and the amplitude component are respectively input to the RF input terminal and the power-supply-voltage terminal of the RF power amplifier. Therefore, this processing is herein referred to as a pseudo-EER technique.

In this embodiment, in a time region (region where the wireless standard is satisfied) in which the pseudo-EER technique is used, the threshold voltage in the level judging circuit is set such that the output voltage exhibits a constant envelope, or the input voltage is adjusted such that a saturated output current is obtained in a period in which the pseudo-EER technique is performed. In this manner, power amplification with the pseudo-EER technique is performed when the amplitude component of the modulated signal is higher than the threshold voltage in the level judging circuit.

Modified Example of Embodiment 2

Figure 5:
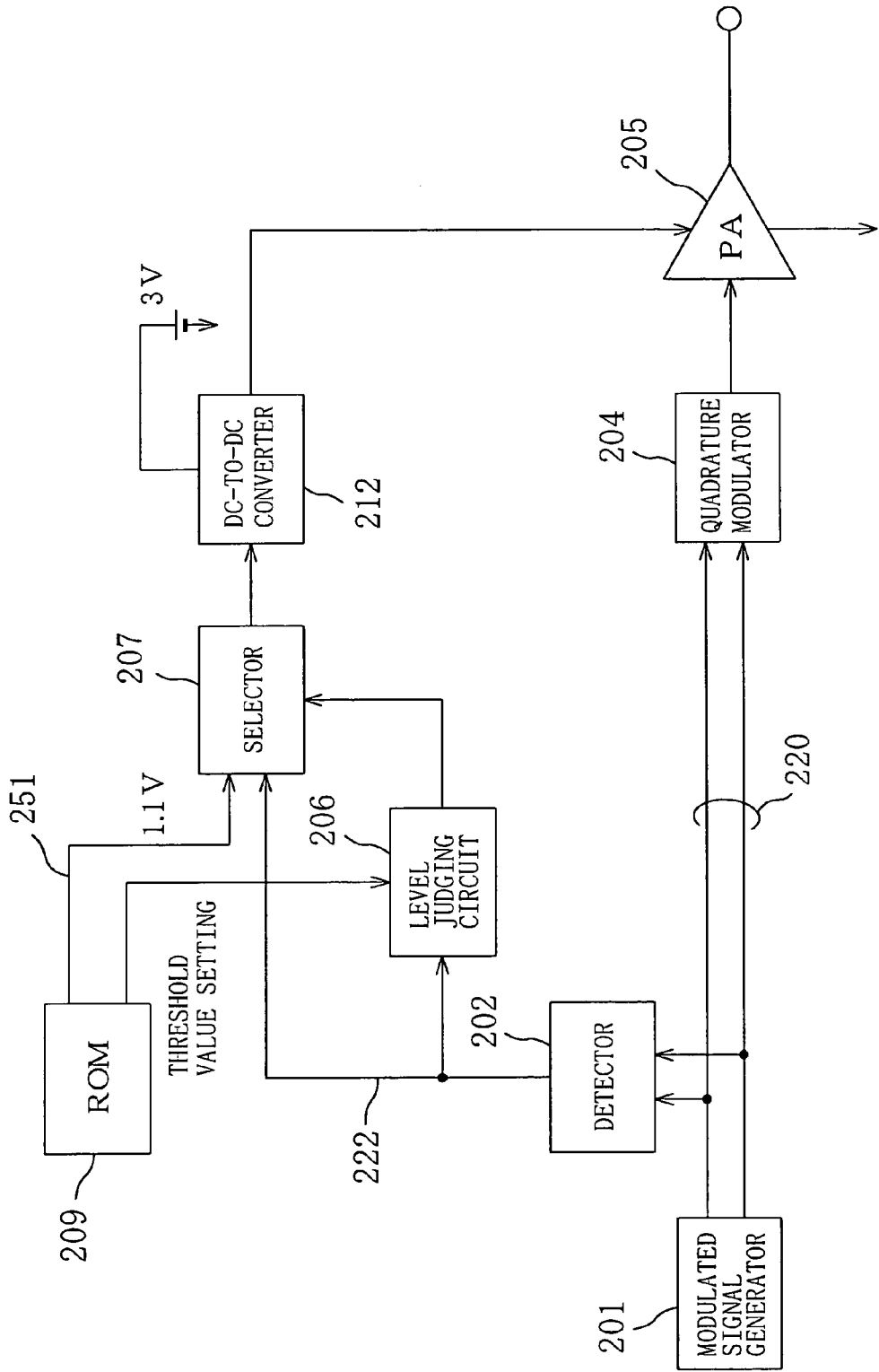
FIG. 5 is a circuit block diagram showing a transmission circuit according to a modified example of the second embodiment.

FIG. 5 is a circuit block diagram schematically showing a configuration of a transmission circuit according to a modified example of the second embodiment. As in the transmission circuit of the second embodiment shown in FIG. 4, the transmission circuit of this modified example also includes: a modulated signal generator 201; a detector 202; a quadrature modulator 204; a PA 205; modulated signal lines 220; and an amplitude component line 222. Basic functions of these circuit elements are the same as those described in the second embodiment.

In this modified example, one DC-to-DC converter 211 is provided and a selector 207 in which a DA converter is incorporated is interposed between the detector 202 and the DC-to-DC converter 211. A threshold voltage level of 1.1 V stored in a ROM 209 as a storage means is supplied to an RF input terminal of the selector 207 through a constant-voltage supply line 251. Specifically, in this modified example, the threshold voltage level to be compared with the voltage level of an amplitude component by a level judging circuit 206 is equal to the level of a constant voltage that is input from the constant-voltage supply line 251 to a power-supply-voltage terminal of the PA 205 via the selector 207. That is, the ROM 209 serves as a means for storing the threshold voltage level as well as a means for supplying the constant voltage to the power-supply-voltage terminal of the PA 205 in the region in which the wireless standard is not satisfied.

Modulating operation in this modified example is basically the same as in the second embodiment, so that the same effects as in the second embodiment are obtained. In addition, in this modified example, only one DC-to-DC converter is sufficient, so that the modified example is more advantageous than the second embodiment in terms of cost reduction. Further, the selector is disposed upstream from the DC-to-DC converter, so that this modified example has another advantage of being able to use a transmitter with a relatively low breakdown voltage as long as the DC-to-DC converter also has an amplifying function.

In particular, the pseudo-EER technique used in the second embodiment or the modified example thereof has an advantage that a low EVM is maintained in a wide band, as compared to the first embodiment. However, the efficiency is enhanced more easily with the method of the first embodiment using the EER technique than with the second embodiment and the modified example thereof.

Now, a device for implementing the transmission circuits of the first and second embodiments and the modified example of the second embodiment will be described.

The modulated signal generator, the detector and the level judging circuit may be mounted on one LSI chip. In this case, the other circuit elements are provided on another LSI chip or discrete chips.

The frequency converting means (e.g., the quadrature converter 104 or 204) is not necessarily provided. But the provision of the quadrature converter 104 or 204 allows a high-frequency signal in a wider band to be used. For example, since the DA converter handles signals with frequencies in the band of several hundreds MHz at most, the DA converter cannot process carriers whose frequencies exceed GHz. However, if the frequency converting means is used, the carrier frequency is up-converted easily.

The frequency converting means such as the quadrature modulator is preferably provided on an LSI chip on which the modulated signal generator, the detector and the level judging circuit are mounted.

The DC-to-DC converter, the selector, the RF power amplifier and the ROM may be individually provided on respective discrete chips for a transmission circuit, or may be provided within a chip on which the modulated signal generator, the detector and the level judging circuit are mounted, as a system LSI. In such a case, one or more circuit elements out of the DC-to-DC converter, the selector, the RF power amplifier and the ROM can be provided on a chip on which the modulated signal generator, the detector and the level judging circuit are mounted.

The ROM for storing the threshold voltage level is not necessarily provided. Alternatively, a signal indicating the threshold voltage level may be input from outside.

The means for inputting the constant voltage to the constant-voltage supply line may be a voltage generator provided on an LSI chip or may be a member for supplying a voltage to the power-supply-voltage terminal from outside.

The transmission circuit according to the present invention is applicable as a transmission section of wireless communication apparatus such as cellular phones and wireless LANs.

What is claimed is:

1. A transmission circuit comprising:
    modulated signal generating means for generating a modulated signal including a phase component and an amplitude component;
    a modulated signal line for transmitting the modulated signal, the modulated signal line being connected to the modulated signal generating means;
    modulated signal detecting means for detecting at least the amplitude component of the modulated signal generated by the modulated signal generating means, the modulated signal detecting means being connected to the modulated signal line;
    an amplitude component line for transmitting the amplitude component of the modulated signal, the amplitude component line being connected to the modulated signal detecting means;
    threshold value inputting means for inputting a threshold value for switching a method for modulating the modulated signal; and
    judging means for judging whether or not an amplitude value of the amplitude component of the modulated signal is larger than the threshold value input from the threshold value inputting means, the judging means being connected to the amplitude component line,
    wherein the modulated signal detecting means also detects the phase component of the modulated signal, and
    the transmission circuit further comprises:
    a phase component line for transmitting the phase component of the modulated signal, the phase component line being connected to the modulated signal detecting means;
    a constant-voltage supply line for supplying a constant voltage;
    first selection outputting means for outputting the modulated signal if the amplitude value of the amplitude component is smaller than or equal to the threshold value, while outputting the phase component if the amplitude value of the amplitude component is larger than the threshold value, based on a judgment result of the judging means, the first selection outputting means being connected to the modulated signal line and the phase component line; and
    second selection outputting means for outputting the constant voltage if the amplitude value of the amplitude component is smaller than or equal to the threshold value, while outputting the amplitude component if the amplitude value of the amplitude component is larger than the threshold value, based on the judgment result of the judging means, the second selection outputting means being connected to the amplitude component line and the constant-voltage supply line.

2. The transmission circuit of claim 1, further comprising DC-to-DC converting means for performing voltage conversion on an output signal from the second selection outputting means, the DC-to-DC converting means being connected to the second selection outputting means.

3. The transmission circuit of claim 2, further comprising an RF power amplifier including an RF input terminal connected to the first selection outputting means and a power-supply-voltage terminal connected to the DC-to-DC converting means.

4. The transmission circuit of claim 3, further comprising means for specifying the level of output power to the modulated signal generating means.

5. The transmission circuit of claim 3, further comprising frequency converting means disposed between the first selection outputting means and the RF power amplifier.

6. The transmission circuit of claim 1, wherein the threshold value is set at a value corresponding to a boundary between a region in which a signal to be transmitted exhibits a linear response and a region in which the signal exhibits a nonlinear response.

7. The transmission circuit of claim 1, wherein the threshold value inputting means is storage means for storing the threshold value, and the judging means performs the judgment using the threshold value stored in the storage means.

8. A transmission circuit comprising:
modulated signal generating means for generating a modulated signal including a phase component and an amplitude component;
a modulated signal line for transmitting the modulated signal, the modulated signal line being connected to the modulated signal generating means;
modulated signal detecting means for detecting at least the amplitude component of the modulated signal generated by the modulated signal generating means, the modulated signal detecting means being connected to the modulated signal line;
an amplitude component line for transmitting the amplitude component of the modulated signal, the amplitude component line being connected to the modulated signal detecting means;
threshold value inputting means for inputting a threshold value for switching a method for modulating the modulated signal;
judging means for judging whether or not an amplitude value of the amplitude component of the modulated signal is larger than the threshold value input from the threshold value inputting means, the judging means being connected to the amplitude component line,
a constant-voltage supply line for supplying a constant voltage; and
selection outputting means for outputting the constant voltage if the amplitude value of the amplitude component is smaller than or equal to the threshold value, while outputting the amplitude component if the amplitude value of the amplitude component is larger than the threshold value, based on a judgment result of the judging means, the selection outputting means being connected to the amplitude component line and the constant-voltage supply line.

9. The transmission circuit of claim 8, further comprising:
first DC-to-DC converting means for performing voltage conversion on the amplitude component, the first DC-to-DC converting means being disposed on the amplitude component line between the modulated signal detecting means and the selection outputting means; and
second DC-to-DC converting means interposed in the constant-voltage supply line.

10. The transmission circuit of claim 8, further comprising DC-to-DC converting means for performing voltage conversion on an output signal from the selection outputting means, the DC-to-DC converting means being connected to the selection outputting means.

11. The transmission circuit of claim 8, further comprising an RF power amplifier including an RF input terminal connected to the modulated signal line and a power-supply-voltage terminal connected to the selection outputting means.

12. The transmission circuit of claim 11, further comprising frequency converting means disposed between the first selection outputting means and the RF power amplifier.

13. The transmission circuit of claim 8, wherein the threshold value inputting means is storage means for storing the threshold value, and the judging means performs the judgment using the threshold value stored in the storage means.

* * * * *